US011824526B2

(12) United States Patent
Qiao et al.

(10) Patent No.: US 11,824,526 B2
(45) Date of Patent: Nov. 21, 2023

(54) CIRCUIT AND CONTROL METHOD FOR PREVENTING FALSE TURN-ON OF SEMICONDUCTOR SWITCHING DEVICE

(71) Applicant: Delta Electronics (Shanghai) Co., Ltd., Shanghai (CN)

(72) Inventors: Lifeng Qiao, Shanghai (CN); Jie Zhao, Shanghai (CN); Dehui Zhang, Shanghai (CN); Erlei Li, Shanghai (CN); Teng Liu, Shanghai (CN); Jianping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 16 days.

(21) Appl. No.: 17/654,242

(22) Filed: Mar. 10, 2022

(65) Prior Publication Data

US 2022/0337237 A1   Oct. 20, 2022

(30) Foreign Application Priority Data

Apr. 16, 2021 (CN) .......................... 202110413919.3

(51) Int. Cl.
 *H03K 17/567* (2006.01)
(52) U.S. Cl.
 CPC .................. *H03K 17/567* (2013.01)
(58) Field of Classification Search
 CPC ...... H03K 17/00; H03K 17/063; H03K 17/16; H03K 17/165; H03K 17/567
 USPC ....................................................... 327/109
 See application file for complete search history.

(56) References Cited

U.S. PATENT DOCUMENTS

| 3,486,045 | A | * | 12/1969 | Frick | H03K 17/60 |
| | | | | | 327/530 |
| 7,889,477 | B2 | * | 2/2011 | Neubarth | H02M 3/3384 |
| | | | | | 361/212 |
| 10,234,880 | B1 | * | 3/2019 | Li | G05F 1/571 |
| 10,367,496 | B2 | * | 7/2019 | Ying | H03F 3/213 |
| 2015/0042397 | A1 | * | 2/2015 | Mathieu | H03K 17/0828 |
| | | | | | 327/381 |

FOREIGN PATENT DOCUMENTS

| CN | 202737833 U | 2/2013 |
| CN | 107846138 A | 3/2018 |
| CN | 108631557 B | 3/2020 |

* cited by examiner

*Primary Examiner* — Cassandra F Cox
(74) *Attorney, Agent, or Firm* — CKC & Partners Co., LLC (57) ABSTRACT

A circuit for preventing false turn-on of a semiconductor switching device includes an active clamp circuit, a control circuit, a power amplifier circuit, and a suppression circuit. The control circuit is coupled to an input of the power amplifier circuit. An output of the power amplifier circuit is coupled to a gate of the semiconductor switching device. The active clamp circuit is configured to operate within a preset period when a voltage between the first end of the semiconductor switching device and a second end of the semiconductor switching device is greater than a preset voltage. The suppression circuit includes a controllable switch, which is configured to turn on after the operation of the active clamp circuit is completed, such that potential at the input of the power amplifier circuit is clamped to a fixed potential.

19 Claims, 7 Drawing Sheets

(Prior Art)

Fig. 1

(Prior Art)

CIRCUIT AND CONTROL METHOD FOR PREVENTING FALSE TURN-ON OF SEMICONDUCTOR SWITCHING DEVICE

CROSS-REFERENCE TO RELATED APPLICATIONS

This non-provisional application claims priority under 35 U.S.C. § 119(a) on Patent Application No. 202110413919.3 filed in P.R. China on Apr. 16, 2021, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

BACKGROUND OF THE INVENTION

1. Field of the Invention

The invention relates to a high power circuit, and particularly to a circuit and a control method for preventing false turn-on of a semiconductor switching device.

2. Related Art

In high power applications, stray inductance in circuits is inevitable. When a power device is turned off, electrodynamic potential induced by the stray inductance is superposed with a bus voltage, producing an extremely high surge voltage across the power device, which may directly cause overvoltage damage to the power device if there are no protection measures. So voltage suppression strategies shall be adopted to protect the power device. The voltage suppression strategies mainly include inactive buffer circuits and active clamp circuits. As compared to the inactive buffer circuits, the active clamp circuits have a faster response and a lower switching loss and are applied to power electronic products more and more widely.

Figure 1:
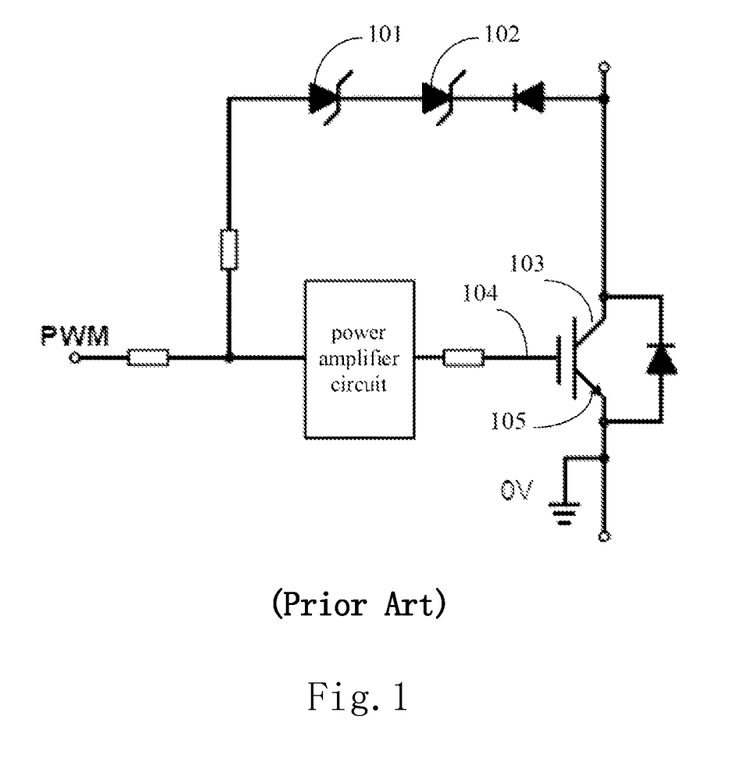
FIG. 1 is a schematic diagram of the conventional active clamp circuit.

A conventional active clamp circuit is shown in FIG. 1. Generally, a TVS Diode 101, a TVS Diode 102, and other circuits are connected in series between a collector 103 and a gate 104 or a gate driving circuit of an Insulated Gate Bipolar Transistor (IGBT). When a collector-emitter voltage exceeds an active clamp threshold voltage, the TVS Diode 101 and the TVS Diode 102 are reversely breakdown, and an electric charge is injected into the gate 104 or the gate driving circuit, such that a gate voltage of IGBT is raised, an impedance between the collector 103 and the emitter 105 is reduced to discharge the electric charge, thereby reducing the collector-emitter voltage, and preventing overvoltage damage to IGBT.

Figure 2:
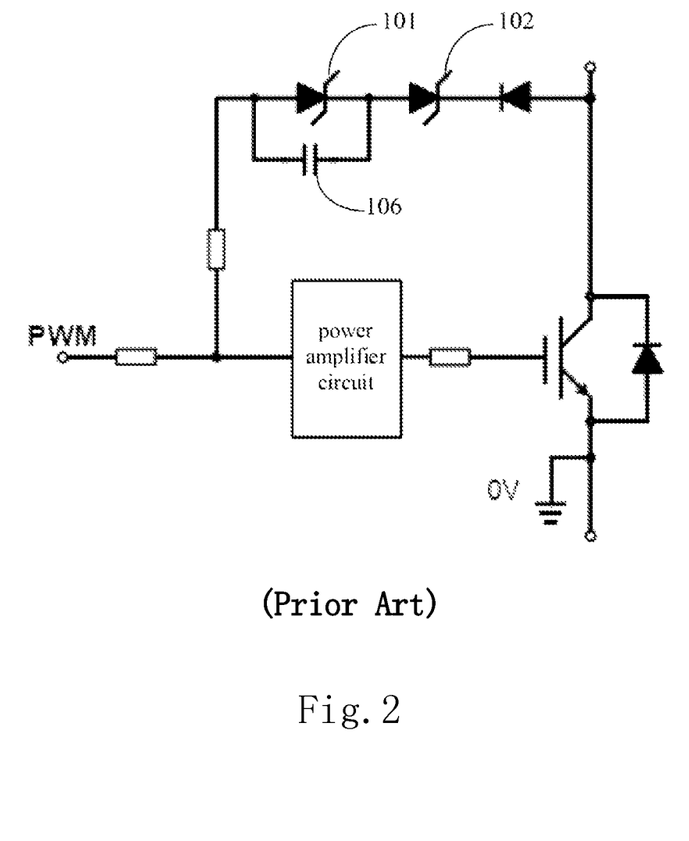
FIG. 2 is a schematic diagram of a displacement current feedback type active clamp circuit.

Therefore, the object of the active clamp circuit is to clamp the collector-emitter voltage of IGBT and prevent overvoltage damage to IGBT. However, signal feedback of the active clamp circuit will take some time, i.e., there is a certain delay from the reverse breakdown of the TVS Diodes to the time when the gate voltage reaches a turn-on threshold voltage of IGBT. During the delay, the collector-emitter voltage of IGBT continues to rise and is not limited until the gate voltage reaches the turn-on threshold voltage or more, which is caused essentially by the lag of the control loop as compared to a controlled object. In applications of a small voltage margin, a fast switching speed, or a large circuit stray inductance, a response speed of the conventional active clamp circuit cannot satisfy requirements for the active clamp. Generally, a capacitor shall be connected in parallel to the TVS Diode in the conventional active clamp circuit, as shown in FIG. 2. Connecting the capacitor 106 in parallel to the TVS Diode may increase a displacement current, such that the gate voltage reaches a turn-on threshold voltage or more before the breakdown of the TVS Diode, thereby realizing the object of clamping the collector-emitter voltage timely.

However, connecting the capacitor 106 in parallel to the TVS Diode 101 introduces a larger driving interference, and the interference signal is injected into the gate of IGBT through the active clamp circuit, such that energy on the gate of IGBT is increased, thereby increasing a risk of false turn-on of IGBT.

As such, in applications with a fast switching speed and a small voltage margin of the power device, energy injected into the gate of IGBT needs to be increased through the active clamp circuit to obtain a better clamping effect, which, however, may bring about a larger interference signal. The interference signal may affect a driving signal of the power device through the active clamp circuit, thereby causing false turn-on of the power device, which affects not only the operating security of the power device itself but also the performance and stability of the entire system.

Therefore, there is a need to prevent false turn-on of the power device caused by the increase of energy injected into the gate of the power device in the active clamp circuit.

SUMMARY OF THE INVENTION

To solve the problem, the invention provides a circuit and a control method for preventing false turn-on of a semiconductor switching device, which can effectively prevent false turn-on of the semiconductor switching device caused by the increase of energy injected into the gate of the semiconductor switching device in the active clamp circuit.

To realize the object, the invention provides a circuit for preventing false turn-on of a semiconductor switching device, comprising:

a power amplifier circuit;

a control circuit, electrically coupled to an input end of the power amplifier circuit;

a semiconductor switching device, wherein the gate of the semiconductor switching device is electrically coupled to an output end of the power amplifier circuit;

an active clamp circuit having a first end and a second end, wherein the first end of the active clamp circuit is electrically connected to a first end of the semiconductor switching device, and the second end of the active clamp circuit is electrically connected to the input end of the power amplifier circuit, and the active clamp circuit is configured to operate within a preset period from a time point when a voltage between the first end of the semiconductor switching device and a second end of the semiconductor switching device is greater than a preset voltage; and a suppression circuit, wherein a first end of the suppression circuit is electrically connected to the control circuit, and a second end of the suppression circuit is electrically connected to the input end of the power amplifier circuit, and a third end of the suppression circuit is electrically connected to a node having a fixed potential;

wherein the suppression circuit further comprises a controllable switch, and the controllable switch is configured to turn on after operation of the active clamp circuit is completed, such that the input end of the power amplifier circuit is clamped to the fixed potential.

In order to better realize the inventive object, the invention further provides a control method for preventing false turn-on of a semiconductor switch, comprising:

providing a circuit architecture comprising an active clamp circuit, a control circuit, a power amplifier circuit and a suppression circuit; wherein the control circuit is coupled to an input end of the power amplifier circuit; an output end of the power amplifier circuit is coupled to a gate of the semiconductor switching device; a first end of the active clamp circuit is connected to a first end of the semiconductor switching device, and a second end of the active clamp circuit is connected to the input end of the power amplifier circuit; the suppression circuit comprises a controllable switch; a first end of the suppression circuit is connected to the control circuit, a second end of the suppression circuit is connected to the input end of the power amplifier circuit, and a third end of the suppression circuit is connected to a fixed potential point;

determining a preset period during which the active clamp circuit operates according to a voltage between the first end of the semiconductor switching device and a second end of the semiconductor switching device; and turning on the controllable switch after operation of the active clamp circuit is completed, such that the input end of the power amplifier circuit is clamped to a fixed electrical potential.

In the invention, after the active clamp circuit completes voltage clamping, the potential at the input of the power amplifier circuit is clamped to the fixed potential to block a transmission path of the interference signal through the interference suppression circuit, such that false turn-on of the semiconductor switching device can be effectively prevented.

Hereinafter the invention is described in detail with reference to the accompanying drawings and the detailed embodiments, but the invention is not limited thereto.

DETAILED EMBODIMENTS OF THE INVENTION

Hereinafter the technical solution of the invention is described in detail with reference to the accompanying drawings and the detailed embodiments, to further understand the object, solution, and effect of the invention, rather than to limit the protection scope of the appended claims of the invention.

Figure 3:
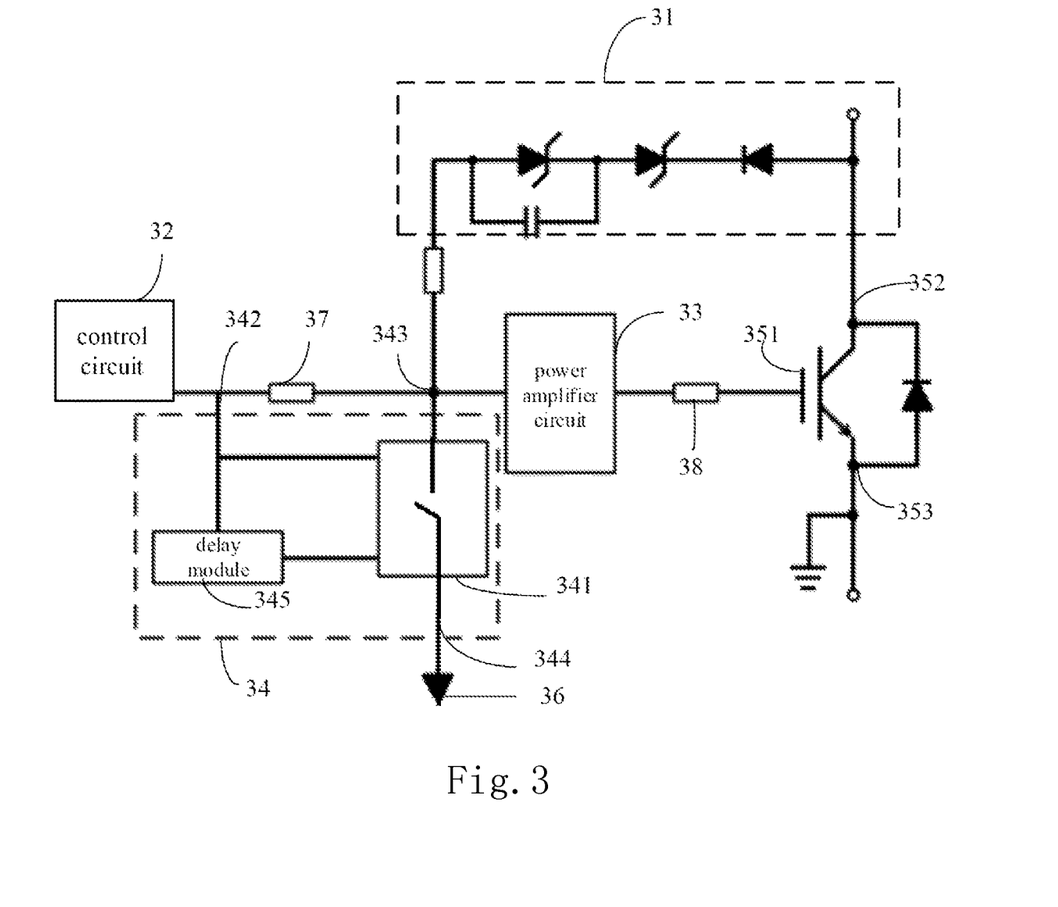
FIG. 3 is a schematic diagram of a first embodiment of a circuit for preventing false turn-on of a semiconductor switching device according to the present disclosure.

FIG. 3 is a schematic diagram of a first embodiment of a circuit for preventing false turn-on of a semiconductor switching device. As shown in FIG. 3, in the exemplary embodiment, the circuit includes an active clamp circuit 31, a control circuit 32, a power amplifier circuit 33, and a suppression circuit 34.

In detail, the control circuit 32 is coupled to an input end of the power amplifier circuit 33. An output end of the power amplifier circuit 33 is coupled to a gate 351 of the semiconductor switching device. For example, the semiconductor switching device may be IGBT. A first end of the active clamp circuit 31 is connected to a first end 352 of the semiconductor switching device, a second end of the active clamp circuit 31 is connected to the input end of the power amplifier circuit 33, and the active clamp circuit 31 is configured to operate within a preset period from a time point when a voltage between the first end 352 of the semiconductor switching device and a second end 353 of the semiconductor switching device is greater than a preset voltage. The suppression circuit 34 includes a controllable switch 341. A first end 342 of the suppression circuit 34 is connected to the control circuit 32, a second end 343 of the suppression circuit 34 is connected to the input end of the power amplifier circuit 33, and a third end 344 of the suppression circuit 34 is connected to the node 36 having a fixed potential. Further, the controllable switch 341 is configured to turn on after operation of the active clamp circuit 31 is completed, such that the input end of the power amplifier circuit 33 is clamped to the fixed potential.

As can be seen, after operation of the active clamp circuit 31 is completed, i.e., after the active clamp circuit 31 completes voltage clamping, by controlling the controllable switch of the suppression circuit 34 to turn on, the input end of the power amplifier circuit 33 is clamped to the fixed potential so as to limit a gate voltage at the gate 351 of the semiconductor switching device, such that the active clamp circuit 31 is disabled after the semiconductor switching device is completely turned off, thereby blocking a transmission path of an interference signal. As such, the problem of false turn-on of the semiconductor switching device is solved without affecting the normal operation of the power amplifier circuit 33 and the active clamp circuit 31.

As shown in FIG. 3, the circuit further includes an input resistor 37 and a driving resistor 38. The input resistor 37 is coupled between the control circuit 32 and the input end of the power amplifier circuit 33. The driving resistor 38 is coupled between the output end of the power amplifier circuit 33 and the gate 351 of the semiconductor switching device.

As shown in FIG. 3, the suppression circuit 34 further includes a delay module 345. The delay module 345 is coupled to the first end 342 of the suppression circuit 34 and the controllable switch 341, respectively, and the delay module is used to receive a control signal, which may be a Pulse Width Modulation (PWM) signal, outputted by the control circuit 32, and to control the controllable switch 341 to turn on after a preset delay time, such that the input end of the power amplifier circuit 33 may be clamped to the fixed potential, thereby blocking a transmission path of an interference signal. As such, the problem of false turn-on of the semiconductor switching device is solved without affecting the normal operation of the semiconductor switching device and the active clamp circuit 31.

Figure 4:
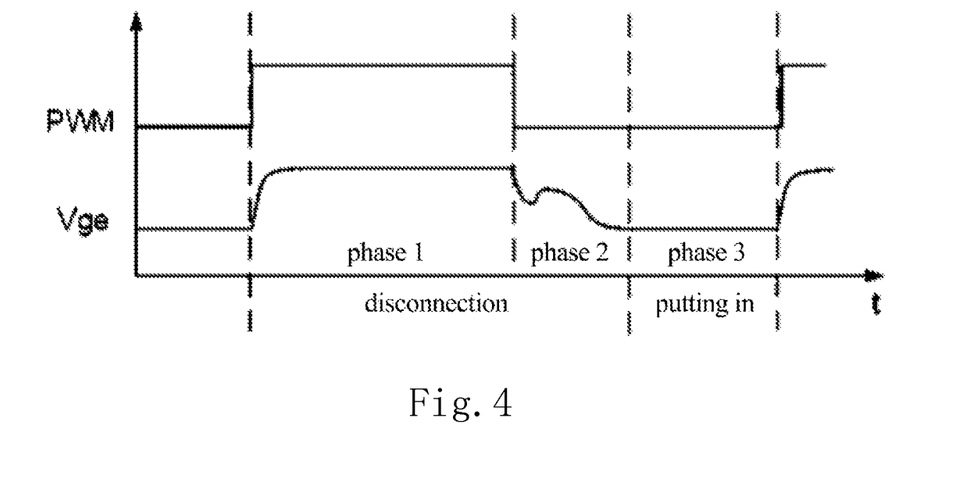
FIG. 4 is a control timing diagram in FIG. 3.

FIG. 4 is a control timing diagram in FIG. 3. In FIG. 4, a longitudinal axis represents a voltage, a horizontal axis represents a time t, PWM represents a control signal of the control circuit 32, and a line Vge represents a gate voltage of the semiconductor switching device. As shown in FIG. 4, in phase 1, the PWM signal outputted by the control circuit 32 is at a high level, and the controllable switch 341 of the suppression circuit 34 is in a non-conductive state according to the high level, while the semiconductor switching device is turned on and works normally. In phase 2, the PWM signal outputted by the control circuit 32 is at a low level, and the delay module 345 works. When a voltage between the first end 352 and the second end 353 of the semiconductor switching device is greater than a preset voltage, the active clamp circuit 31 operates, and an electric charge flowing out of the first end 352 of the semiconductor switching device is injected into the gate 351 of the semiconductor switching device through the active clamp circuit 31. The gate voltage at the gate 351 of the semiconductor switching device increases, such that the gate voltage is greater than a preset gate voltage and the semiconductor switching device is delayed to turn off, thereby limiting a voltage peak between the first end 352 and the second end 353 of the semiconductor switching device, and allowing the semiconductor switching device not to be damaged. The preset period during the operation of the active clamp circuit 31 starts at a time point when the voltage between the first end 352 and the second end 353 of the semiconductor switching device is greater than the preset voltage, and ends at a time point when the operation of the active clamp circuit 31 is completed. In phase 3, after operation of the active clamp circuit 31 is completed, the PWM signal outputted by the control circuit 32 is still at a low level, and operation of the delay module 345 is completed, so the gate of the semiconductor switching device is at a preset gate voltage. The preset gate voltage may be less than a gate voltage threshold of the semiconductor switching device so that the controllable switch 341 turns on, and the input end of the power amplifier circuit 33 is clamped to the fixed potential, thereby blocking the interference signal from affecting the turn-off of the semiconductor switching device through the active clamp circuit, and ensuring reliable turn-off of the semiconductor switching device. The fixed potential may be lower than the gate voltage threshold of the semiconductor switching device. For example, when the gate voltage threshold is 6 Volt, the fixed electrical potential is less than 6 Volt and may be any voltage between 0 and −20 Volt. It shall be noted that a preset time delayed by the delay module 345 corresponds to a period in phase 2, i.e., a preset delay time starts at a time point when the PWM signal is converted from the high level into the low level and ends at a time point when the operation of the active clamp circuit is completed.

In this solution, the preset delay time shall be designed by an operation time of the active clamp circuit in the worst working conditions. Since a difference between the operation times of the active clamp circuit in different working conditions may amount to several microseconds, and issues of precision and temperature drift of the components shall be taken into consideration, the preset delay time is far larger than the operation time of the active clamp circuit, such that the suppression circuit cannot work immediately after operation of the active clamp circuit is completed. The solution is complicated in design, while also bringing a protection blind zone, and reducing reliability. It shall be further improved.

Figure 9:
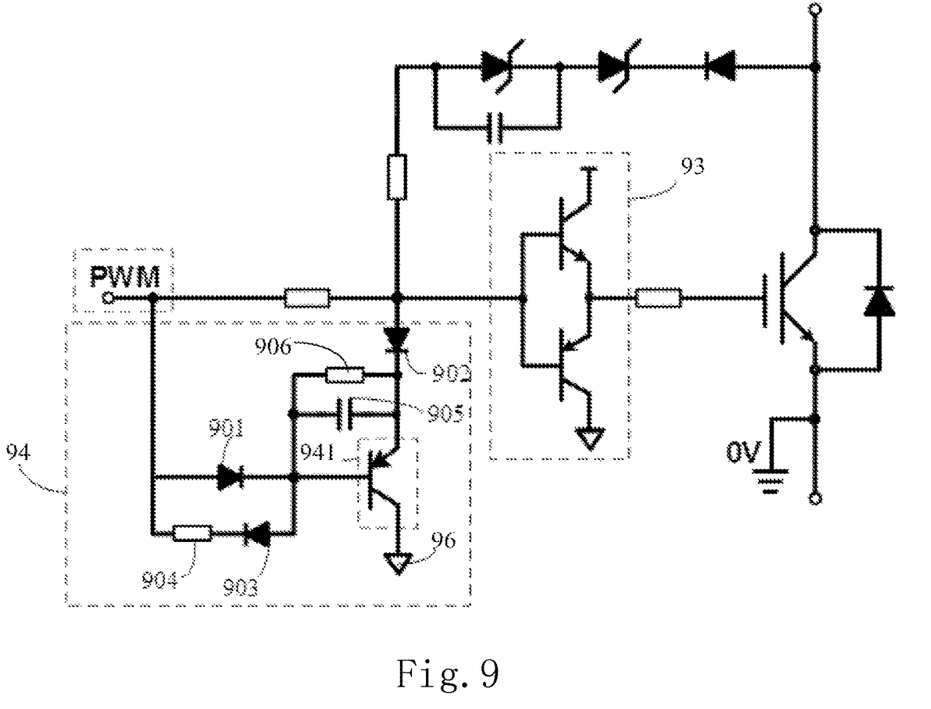
FIG. 9 is a schematic diagram of one embodiment of a suppression circuit according to the present disclosure.

FIG. 9 is a schematic diagram of one embodiment of an interference suppression circuit according to the present disclosure. As shown in FIG. 9, a suppression circuit 94 includes a fourth diode 901, a fifth diode 902, a sixth diode 903, a second resistor 904, a third resistor 906 and a second capacitor 905. An anode of the fourth diode 901 is coupled to the first end of the suppression circuit 94, and a cathode of the fourth diode 901 is coupled to a gate of the controllable switch 941. An anode of the fifth diode 902 is coupled to the second end of the suppression circuit 94, and a cathode of the fifth diode 902 is coupled to a first end of the controllable switch 941. The sixth diode 903 and the second resistor 904 are coupled in series between the gate of the controllable switch 941 and the anode of the fourth diode 901. The second capacitor 905 is coupled between the first end of the controllable switch 941 and the gate of the controllable switch 941. The third resistor 906 is connected between the cathode of the fifth diode 902 and the cathode of the fourth diode 901. A second end of the controllable switch 941 is coupled to the third end of the suppression circuit 94, and the third end of the suppression circuit 94 is connected to the node 96 having a fixed potential.

As shown in FIG. 9, when the PWM signal is at a high level, the fourth diode 901 is turned on, a voltage potential at the gate of the controllable switch 941 is pulled up, such that the controllable switch 941 is turned off, and the PWM signal is amplified by the power amplifier circuit 93 and the amplified PWM signal drives the semiconductor switching device to turn on. When the PWM signal is at a low level, if a voltage between the first end and the second end of the semiconductor switching device is greater than a preset voltage, the active clamp circuit operates, and the fifth diode 902 and the sixth diode 903 are turned on, and the second capacitor 905 is discharged through the second resistor 904. Accordingly, the controllable switch 941 is in a non-conductive state, and current flows into the gate of the semiconductor switching device, such that a gate voltage of the semiconductor switching device increases, and the semiconductor switching device is turned on. After the operation of the active clamp circuit is completed and the PWM signal is still at a low level, once an interference signal is injected into the second capacitor 905 through the active clamp circuit to charge the second capacitor 905 reversely, such that a gate voltage of the controllable switch 941 reaches a gate voltage threshold, the controllable switch 941 is turned on, and the input end of the power amplifier circuit 93 is clamped to the fixed potential.

In the embodiment of the present disclosure, the delay module includes the second resistor 904 and the second capacitor 905, and when the PWM signal is at a low level, the delay module produces a preset delay time to ensure that the controllable switch 941 is turned on after operation of the active clamp circuit is completed.

In the embodiment of the present disclosure, the fixed potential is less than a gate voltage threshold of the semiconductor switching device, such that the input end of the power amplifier circuit 93 is clamped to the fixed potential, thereby preventing false turn-on of the semiconductor switching device.

As shown in FIG. 9, in one embodiment of the present disclosure, the controllable switch 941 may be a PNP-type transistor, and the first end of the controllable switch 941 is an emitter of the PNP-type transistor, and the second end of the controllable switch 941 is a collector of the PNP-type transistor.

Figure 5:
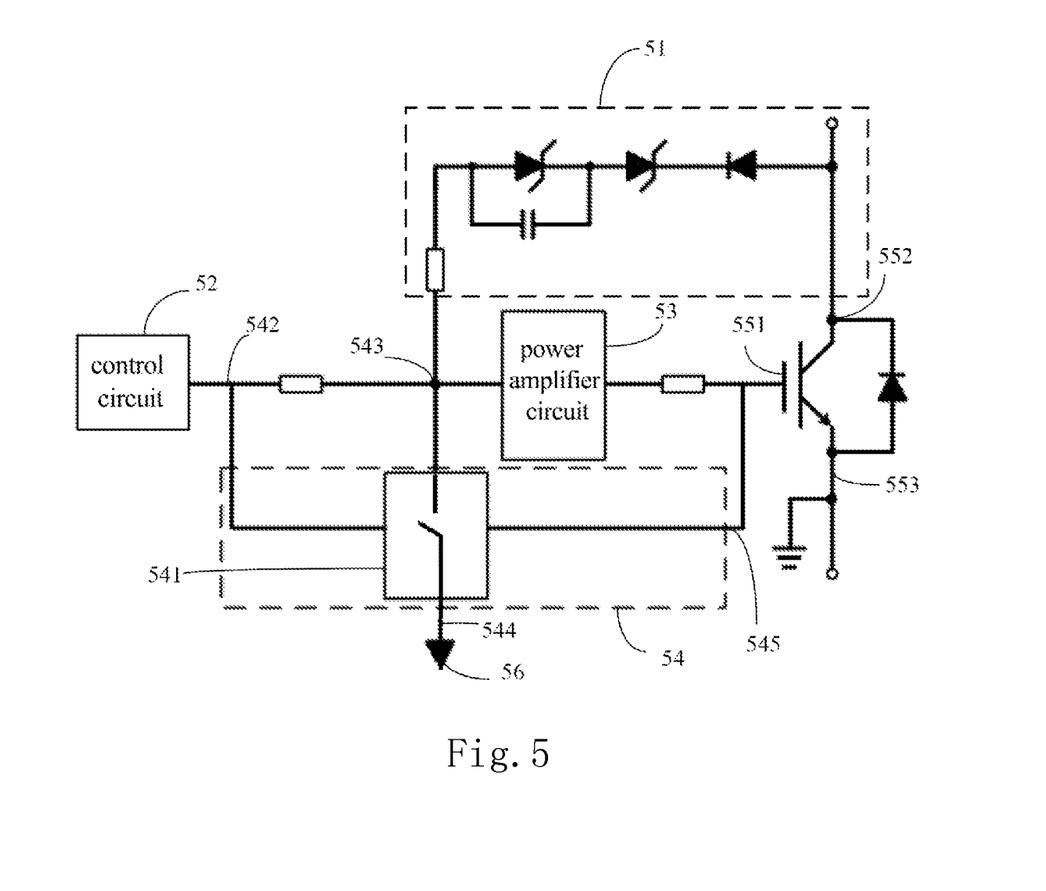
FIG. 5 is a schematic diagram of a second embodiment of a circuit for preventing false turn-on of a semiconductor switching device according to the present disclosure.

FIG. 5 is a schematic diagram of a second embodiment of a circuit for preventing false turn-on of a semiconductor switching device. As shown in FIG. 5, in the exemplary embodiment, the circuit architecture includes an active clamp circuit 51, a control circuit 52, a power amplifier circuit 53, and a suppression circuit 54.

In detail, the control circuit 52 is coupled to an input end of the power amplifier circuit 53. An output end of the power amplifier circuit 53 is coupled to a gate 551 of the semiconductor switching device. A first end of the active clamp circuit 51 is connected to a first end 552 of the semiconductor switching device, a second end of the active clamp circuit 51 is connected to the input end of the power amplifier circuit 53. The active clamp circuit 51 is configured to operate within a preset period from a time point when a voltage between the first end 552 of the semiconductor switching device and a second end 553 of the semiconductor switching device is greater than a preset voltage. The suppression circuit 54 includes a controllable switch 541. A first end 542 of the suppression circuit 54 is connected to the control circuit 52, a second end 543 of the suppression circuit 54 is connected to the input end of the power amplifier circuit 53, and a third end 544 of the suppression circuit 54 is connected to the node 56 having a fixed potential, and a fourth end 545 of the suppression circuit 54 is connected to the gate 551 of the semiconductor switching device. Further, the controllable switch 541 is configured to turn on after operation of the active clamp circuit 51 is completed, i.e., a gate voltage of the semiconductor switching device is a preset gate voltage, and the controllable switch 541 is turned on, such that the input end of the power amplifier circuit 53 is clamped to the fixed potential.

Figure 6:
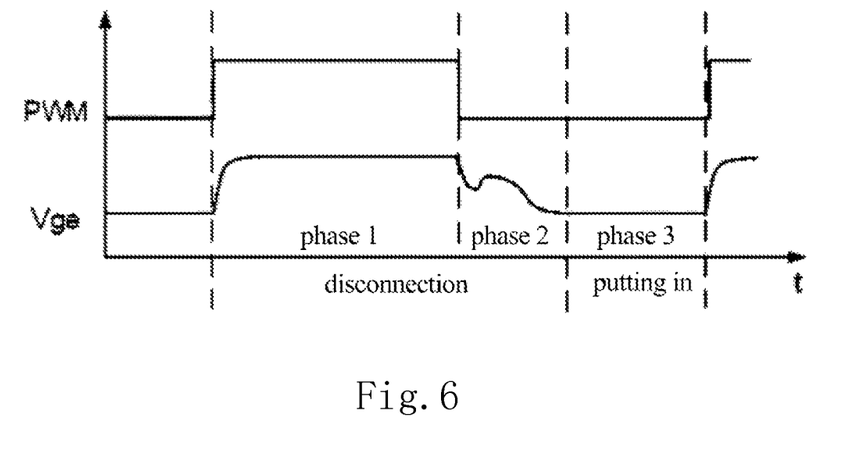
FIG. 6 is a control timing diagram in FIG. 5.

FIG. 6 is a control timing diagram in FIG. 5. In FIG. 6, a longitudinal axis represents a voltage, a horizontal axis represents a time t, PWM represents a control signal outputted by the control circuit 52, and a line Vge represents a gate voltage of the semiconductor switching device. As shown in FIG. 6, in phase 1, the PWM signal outputted by the control circuit 52 is at a high level, so the controllable switch 541 is in a non-conductive state according to the high level. In phase 2, the PWM signal outputted by the control circuit 52 is at a low level. When a voltage between the first end 552 and the second end 553 of the semiconductor switching device is greater than a preset voltage, the active clamp circuit 51 operates, so the gate voltage of the semiconductor switching device is greater than a preset gate voltage, and the controllable switch 541 is in a non-conductive state. In phase 3, operation of the active clamp circuit 51 is completed, and the PWM signal outputted by the control circuit 52 is still at a low level, so the gate of the semiconductor switching device is a preset gate voltage, the controllable switch 541 is controlled to turn on according to the preset gate voltage, and the input end of the power amplifier circuit 53 is clamped to the fixed potential. In addition, the preset gate voltage is less than a gate voltage threshold of the semiconductor switching device. A turn-on time point of the controllable switch can be automatically set according to an adjustable operation time of the active clamp circuit. And the delay time is nearly zero and greatly reduces a protection blind zone and improves reliability.

Figure 7:
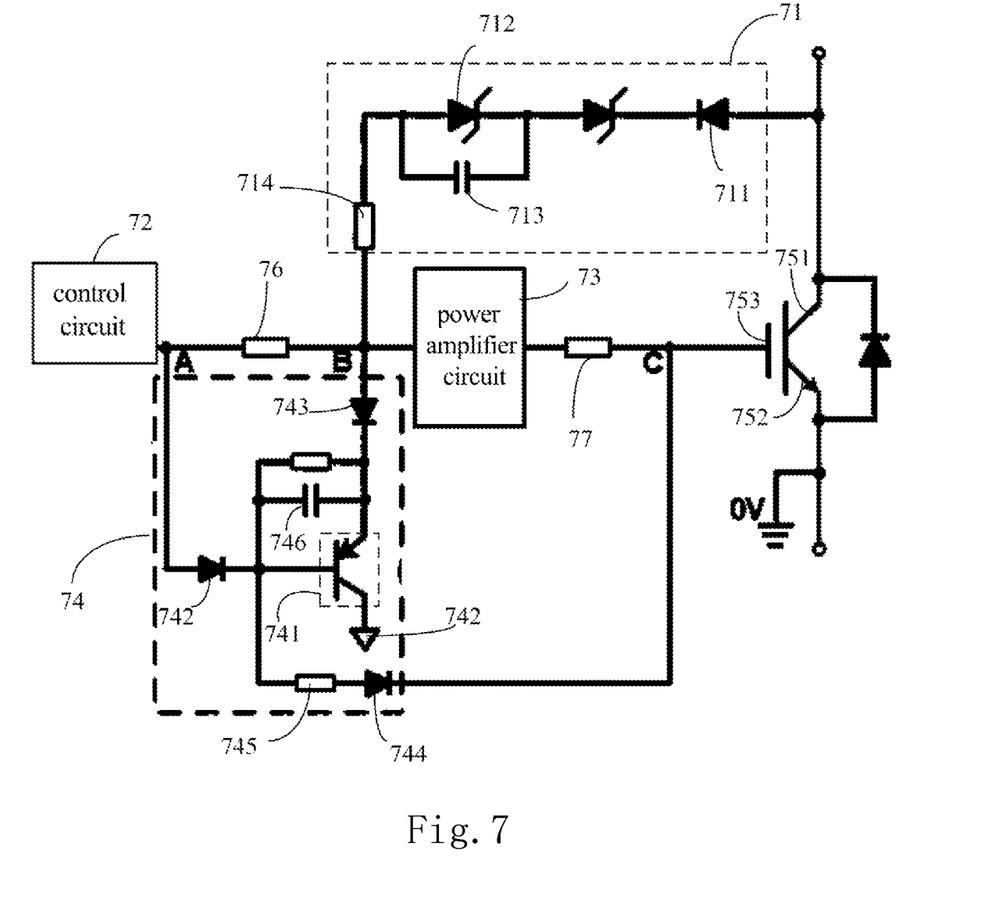
FIG. 7 is a schematic diagram of one embodiment of a suppression circuit according to the present disclosure.

FIG. 7 is one embodiment of a suppression circuit according to the present disclosure. As shown in FIG. 7, in the exemplary embodiment, the circuit architecture includes an active clamp circuit 71, a control circuit 72, a power amplifier circuit 73 and a suppression circuit 74.

In detail, the control circuit 72 is coupled to an input end of the power amplifier circuit 73. An output end of the power amplifier circuit 73 is coupled to a gate 753 of the semiconductor switching device. A first end of the active clamp circuit 71 is connected to a first end 751 of the semiconductor switching device, a second end of the active clamp circuit 71 is connected to the input end B of the power amplifier circuit 73. The active clamp circuit 71 is configured to operate within a preset period from a time point when a voltage between the first end 751 of the semiconductor switching device and a second end 752 of the semiconductor switching device is greater than a preset voltage. The suppression circuit 74 further includes a controllable switch 741. A first end A of the suppression circuit 74 is connected to the control circuit 72, a second end of the suppression circuit is connected to the input end B of the power amplifier circuit 73, a third end of the suppression circuit 74 is connected to the node 742 having a fixed potential, and a fourth end of the suppression circuit 74 is connected to the gate 753 of the semiconductor switching device. The controllable switch 741 is configured to turn on after operation of the active clamp circuit 71 is completed, such that the input end B of the power amplifier circuit 73 is clamped to the fixed potential.

As can be seen, in the above embodiment, by use of the suppression circuit 74, the electrical potential at the input end B of the power amplifier circuit 73 is clamped to the fixed potential after operation of the active clamp circuit 71 is completed, thereby limiting a gate voltage at the gate 753 of the semiconductor switching device, and effectively preventing false turn-on of the semiconductor switching device.

As shown in FIG. 7, in another embodiment of the present disclosure, the circuit further includes an input resistor 76 and a driving resistor 77. The input resistor 76 is coupled between the control circuit 72 and the input end B of the power amplifier circuit 73. The driving resistor 77 is coupled between the output end of the power amplifier circuit 73 and the gate 753 of the semiconductor switching device.

Referring to FIGS. 6 and 7, the controllable switch 741 is configured to turn off when the control circuit 72 outputs a high level (phase 1), or the gate voltage of the semiconductor switching device is greater than a preset gate voltage (phase 2). Therefore, the controllable switch 741 is turned off in phase 1 and phase 2, and the suppression circuit 74 does not operate.

Referring to FIGS. 6 and 7, in another embodiment of the present disclosure, the controllable switch 741 is configured to turn on when the operation of the active clamp circuit 71 is completed and the gate voltage of the semiconductor switching device is a preset gate voltage (phase 3), and the preset gate voltage is less than a gate voltage threshold of the semiconductor switching device. As can be seen, in phase 3, the active clamp circuit 71 does not work, so false turn-on of the semiconductor switching device shall be prevented, the controllable switch 741 is turned on, the suppression circuit is put into use, and a voltage at the input end B is clamped to the fixed potential, thereby effectively preventing false turn-on of the semiconductor switching device.

Referring to FIG. 7, in another embodiment of the present disclosure, a fourth end of the suppression circuit 74 is electrically coupled to the gate of the semiconductor switching device and the junction node therebetween is labeled as C. The suppression circuit receives the gate voltage, such that determination of phase 2 in FIG. 6 is completed using the gate voltage.

Referring to FIG. 7, in another embodiment of the present disclosure, the suppression circuit 74 further includes a first diode 742, a second diode 743, a third diode 744, a first resistor 745 and a first capacitor 746. An anode of the first diode 742 is coupled to the first end of the suppression circuit 74, and a cathode of the first diode 742 is coupled to a gate of the controllable switch 741. An anode of the second diode 743 is coupled to the second end of the suppression circuit 74, and a cathode of the second diode 743 is coupled to a first end of the controllable switch 741. The first capacitor 746 is coupled between the first end of the controllable switch 741 and the gate of the controllable switch 741. The first resistor 745 and the third diode 744 are connected in series and then coupled between the gate of the controllable switch and the fourth end of the suppression circuit 74. A second end of the controllable switch 741 is coupled to the third end of the suppression circuit 74, and the third end of the suppression circuit 74 is connected to the node 742 having the fixed potential.

In another embodiment, the first capacitor 746 may be a parasitic capacitor between the first end of the controllable switch 741 and the gate of the controllable switch.

As shown in FIG. 7, in one embodiment of the present disclosure, the controllable switch 741 is a PNP-type transistor. Further, the first end of the controllable switch 741 is an emitter of the PNP-type transistor, and the second end of the controllable switch 741 is a collector of the PNP-type transistor.

As shown in FIG. 7, in one embodiment of the present disclosure, the active clamp circuit 71 includes a seventh diode 711, a plurality of TVS Diodes 712, at least one third capacitor 713, and a fourth resistor 714. The plurality of TVS Diodes 712, the seventh diode 711, and the fourth resistor 714 are connected in series between the first end 751 of the semiconductor switching device and the input end of the power amplifier circuit 73. The plurality of TVS Diodes 712 is arranged in the same direction, opposite to a direction of the seventh diode 711. And at least one of the plurality of TVS Diodes 712 is connected in parallel to the at least one third capacitor 713.

As shown in FIG. 7, when the controllable switch 741 is turned on, a potential at the input end B of the power amplifier circuit 73 is clamped to a low fixed potential (such as grounded potential), so a transmission path of flowing energy fed back by the active clamp circuit 71 to the gate is blocked. When the controllable switch 741 is turned off, the transmission path of flowing energy fed back by the active clamp circuit 71 to the gate is open again. Control timing of the circuit is shown in FIG. 6. In phase 1, the PWM signal is at a high level, so a potential at node A is higher than a potential at node B, such that a gate and an emitter of the controllable switch 741 are biased in reverse direction and the controllable switch 741 is turned off. In phase 2, during the operation of the active clamp circuit, the potential at node B is lower than the electrical potential of the gate 753 of the semiconductor switching device, and the gate and the emitter of the controllable switch 741 are biased in reverse direction and the controllable switch 741 is turned off. In phase 3, operation of the active clamp circuit is completed, and potentials of the base of the controllable switch 741 and the gate 753 of the semiconductor switching device are at a low level, so interfering energy is injected via the active clamp circuit, such that the electrical potential at the node B is increased instantly, and the base and the emitter of the controllable switch 741 are biased in position direction and the controllable switch 741 is turned on, thereby injecting interfering energy into the fixed potential to avoid false turn-on of the semiconductor switching device.

Figure 8:
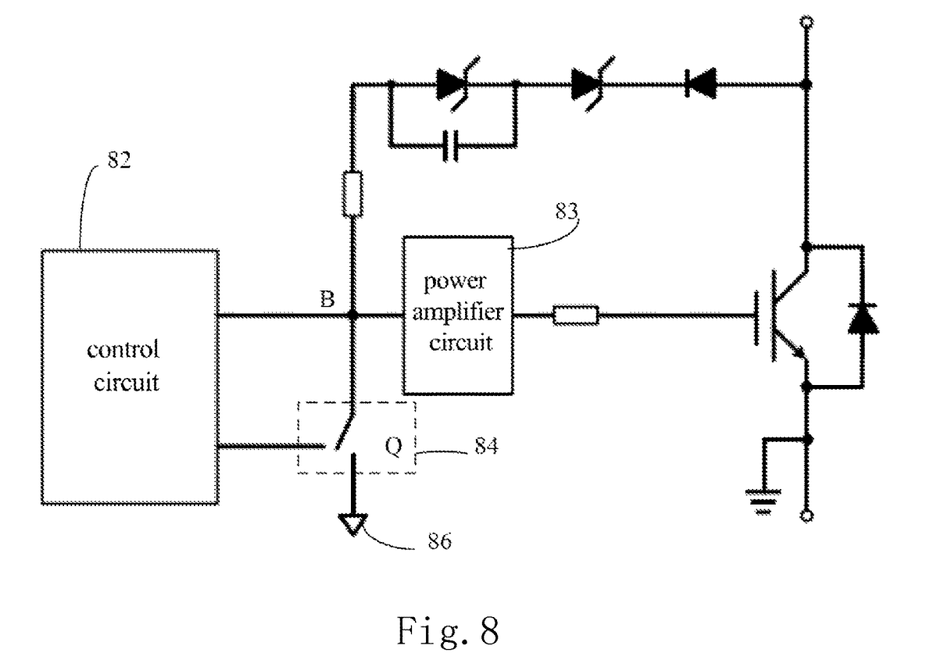
FIG. 8 is a schematic diagram of a third embodiment of a circuit for preventing false turn-on of a semiconductor switching device according to the present disclosure.

FIG. 8 is a schematic diagram of a third embodiment of a circuit for preventing false turn-on of a semiconductor switching device. In the exemplary embodiment, the circuit includes a fully-controlled switch Q. A gate of the fully-controlled switch Q is connected to a first end of the suppression circuit 84, and a first end of the fully-controlled switch Q is connected to a second end (a node B in the figure) of the suppression circuit 84, and a second end of the fully-controlled switch Q is coupled to a third end (a fixed potential node 86) of the suppression circuit 84. The control circuit 82 is configured to control the fully-controlled switch Q to turn on or turn off according to a working state of the active clamp circuit and a control signal outputted by the control circuit 82. In the phase during which the semiconductor switching device is turned on and the active clamp circuit operates, the control circuit 82 turns off the fully-controlled switch Q, and after operation of the active clamp circuit is completed, the control circuit 82 turns on the fully-controlled switch Q and pulls the electrical potential at the input end B of the power amplifier circuit 83 to a low potential. The control timing is shown in FIG. 6, and a specific control process is as follows: when the PWM signal outputted by the controller is at a high level, the controller sends a turn-off signal to the fully-controlled switch Q, and when the controller judges that the operation phase of the active clamp circuit is completed, the controller turns on the fully-controlled switch Q and disables the active clamp circuit. The signal for judging completion of the active clamp phase may be the gate voltage of the semiconductor switching device, and may also be other signals. If the gate voltage of the semiconductor switching device is used as a turn-on signal of the fully-controlled switch Q, it may be designed that when the gate voltage of the semiconductor switching device is less than a voltage b, the fully-controlled switch Q is turned on, where the value of b shall be set to avoid influence on the active clamp function. The lower the b value is, the less the influence on voltage clamping will be.

Figure 10:
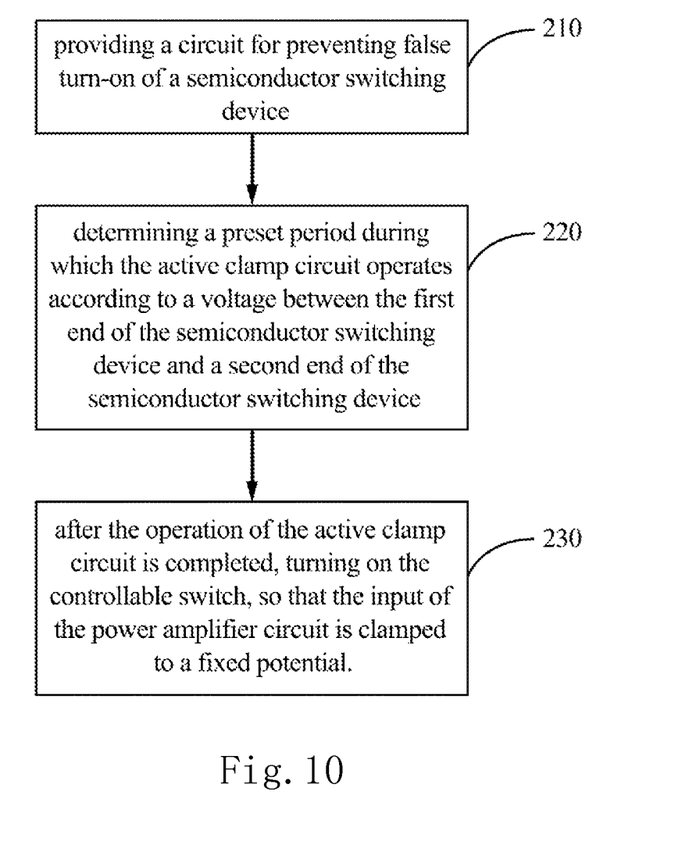
FIG. 10 is a flow chart of a method for preventing false turn-on of a semiconductor switching device according to the present disclosure.

FIG. 10 is a flow chart of a method for preventing false turn-on of a semiconductor switching device. Referring to FIGS. 3 and 10, in the exemplary method, the control method may be realized by step 210 to step 230.

step 210, providing a circuit for preventing false turn-on of a semiconductor switching device. The circuit includes an active clamp circuit 31, a control circuit 32, a power amplifier circuit 33, and a suppression circuit 34. The control circuit 32 is coupled to an input of the power amplifier circuit 33. An output of the power amplifier circuit 33 is coupled to a gate 351 of the semiconductor switching device. A first end of the active clamp circuit 31 is connected to a first end 352 of the semiconductor switching device, and a second end of the active clamp circuit 31 is connected to the input of the power amplifier circuit 33. The suppression circuit 34 includes a controllable switch 341. A first end of the suppression circuit 34 is connected to the control circuit 32, a second end of the suppression circuit 34 is connected to the input of the power amplifier circuit 33, and a third end of the suppression circuit 34 is connected to the node 36 having a fixed potential.

step 220, determining a preset period during which the active clamp circuit operates according to a voltage between the first end of the semiconductor switching device and a second end of the semiconductor switching device; and step 230, after the operation of the active clamp circuit is completed, turning on the controllable switch, so that the input of the power amplifier circuit is clamped to a fixed potential.

In one method embodiment, when the PWM signal outputted by the control circuit 32 is at a high level, the semiconductor switching device is turned on, and the controllable switch is turned off. When the PWM signal outputted by the control circuit 32 is converted from a high level into a low level, and the voltage between the first end of the semiconductor switching device and the second end of the semiconductor switching device is greater than a preset voltage, the active clamp circuit begins to operate.

As can be seen, in a period during which the PWM signal outputted by the control circuit 32 is at a low level and the active clamp circuit does not work, the electrical potential is clamped through the suppression circuit to block the gate of the semiconductor switching device from exceeding a gate voltage threshold, thereby preventing false turn-on.

In one method embodiment, the fixed potential is less than a gate voltage threshold of the semiconductor switching device.

In one method embodiment, when the control circuit outputs a high level, or a gate voltage of the semiconductor switching device is greater than a preset gate voltage, the controllable switch is turned off.

In one method embodiment, when the operation of the active clamp circuit is completed, and a gate voltage of the semiconductor switching device is a preset gate voltage, the controllable switch is turned on.

In one method embodiment, the controllable switch is turned off during the preset period when the active clamp circuit operates.

In one method embodiment, the operation of the active clamp circuit starts at the time point when a voltage between the first end and the second end of the semiconductor switching device is greater than a preset gate voltage, and ends at the time point when a gate voltage of the semiconductor switching device is the preset gate voltage.

As can be known, the present disclosure includes at least one of the following advantages:

1. Suitable for semiconductor switching devices, and also suitable for applications of a small voltage margin and a fast switching speed, and effectively solves the interference problem of the gate drive of the semiconductor switching device.
2. Suitable for a wide application, and the anti-interference circuit may be used in combination with various active clamp circuits.
3. Simple design parameters, and it is unnecessary to design delay parameters according to the operation time of the active clamp circuit.
4. High reliability, and the circuit minimizes the delay time and greatly reduces the protection blind zone.

Of course, the present disclosure may have various other embodiments, and without departing from the spirit and essence of the application, those skilled in the art shall make various corresponding modifications and variations to the application, but these corresponding modifications and variations shall belong to the scope protected by the appended claims of the application.

What is claimed is:

1. A circuit for preventing false turn-on of a semiconductor switching device, comprising:
    a power amplifier circuit;
    a control circuit, electrically coupled to an input end of the power amplifier circuit;
    a semiconductor switching device, wherein the gate of the semiconductor switching device is electrically coupled to an output end of the power amplifier circuit;
    an active clamp circuit having a first end and a second end, wherein the first end of the active clamp circuit is electrically connected to a first end of the semiconductor switching device, and the second end of the active clamp circuit is electrically connected to the input end of the power amplifier circuit, and the active clamp circuit is configured to operate within a preset period from a time point when a voltage between the first end of the semiconductor switching device and a second end of the semiconductor switching device is greater than a preset voltage; and
    a suppression circuit, wherein a first end of the suppression circuit is electrically connected to the control circuit, and a second end of the suppression circuit is electrically connected to the input end of the power amplifier circuit, and a third end of the suppression circuit is electrically connected to a node having a fixed potential;
    wherein the suppression circuit further comprises a controllable switch, and the controllable switch is configured to turn on after operation of the active clamp circuit is completed, such that the input end of the power amplifier circuit is clamped to the fixed potential.

2. The circuit according to claim 1, further comprising:
    an input resistor electrically coupled between the control circuit and the input end of the power amplifier circuit; and
    a driving resistor electrically coupled between the output end of the power amplifier circuit and the gate of the semiconductor switching device.

3. The circuit according to claim 1, wherein the controllable switch is configured to turn off when the control circuit outputs a high level or a gate voltage of the semiconductor switching device is greater than a preset gate voltage.

4. The circuit according to claim 1, wherein the controllable switch is configured to turn on when the operation of the active clamp circuit is completed and a gate voltage of the semiconductor switching device is equal to a preset gate voltage, wherein the preset gate voltage is less than a gate voltage threshold of the semiconductor switching device.

5. The circuit according to claim 1, wherein the controllable switch is configured to turn off within the preset period.

6. The circuit according to claim 1, wherein a fourth end of the suppression circuit is coupled to the gate of the semiconductor switching device and receives a gate voltage of the semiconductor switching device.

7. The circuit according to claim 6, wherein the suppression circuit further comprises:
    a first diode, wherein an anode of the first diode is coupled to the first end of the suppression circuit, and a cathode of the first diode is coupled to a gate of the controllable switch;
    a second diode, wherein an anode of the second diode is coupled to the second end of the suppression circuit, and a cathode of the second diode is coupled to a first end of the controllable switch;
    a first capacitor coupled between the first end of the controllable switch and the gate of the controllable switch;
    a first resistor; and a third diode, wherein the first resistor and the third diode are connected in series and coupled between the gate of the controllable switch and the fourth end of the suppression circuit;

wherein a second end of the controllable switch is coupled to the third end of the suppression circuit.

8. The circuit according to claim 7, wherein the first capacitor is a parasitic capacitor between the first end of the controllable switch and the gate of the controllable switch.

9. The circuit according to claim 1, wherein a gate of the controllable switch is connected to the first end of the suppression circuit, a first end of the controllable switch is connected to the second end of the suppression circuit, and a second end of the controllable switch is coupled to the third end of the suppression circuit; and the control circuit is configured to control the controllable switch to turn on or turn off according to a gate voltage of the semiconductor switching device and a control signal outputted by the control circuit.

10. The circuit according to claim 1, wherein the suppression circuit comprises:
a fourth diode, wherein an anode of the fourth diode is coupled to the first end of the suppression circuit, and a cathode of the fourth diode is coupled to a gate of the controllable switch;
a fifth diode, wherein an anode of the fifth diode is coupled to the second end of the suppression circuit, and a cathode of the fifth diode is coupled to a first end of the controllable switch;
a second resistor;
a sixth diode, wherein the sixth diode and the second resistor are connected in series and coupled between the gate of the controllable switch and the anode of the fourth diode; and
a second capacitor, wherein the second capacitor is coupled between the first end of the controllable switch and the gate of the controllable switch;
wherein a second end of the controllable switch is coupled to the third end of the suppression circuit.

11. The circuit according to claim 1, wherein the fixed potential is less than a gate voltage threshold of the semiconductor switching device.

12. The circuit according to claim 1, wherein the controllable switch is a PNP-type transistor; and the first end of the controllable switch is an emitter of the PNP-type transistor, and the second end of the controllable switch is a collector of the PNP-type transistor.

13. The circuit according to claim 1, wherein the active clamp circuit comprises a seventh diode, a plurality of TVS Diodes, at least one third capacitor and a fourth resistor;
the plurality of TVS Diodes, the seventh diode and the fourth resistor are connected in series between the first end of the semiconductor switching device and the input end of the power amplifier circuit, wherein the plurality of TVS Diodes are arranged in a same direction and opposite to a direction of the seventh diode, and at least one of the plurality of TVS Diodes is connected in parallel to the at least one third capacitor.

14. A control method for preventing false turn-on of a semiconductor switching device, comprising:
providing a circuit architecture comprising an active clamp circuit, a control circuit, a power amplifier circuit and a suppression circuit; wherein the control circuit is coupled to an input end of the power amplifier circuit; an output end of the power amplifier circuit is coupled to a gate of the semiconductor switching device; a first end of the active clamp circuit is connected to a first end of the semiconductor switching device, and a second end of the active clamp circuit is connected to the input end of the power amplifier circuit; the suppression circuit comprises a controllable switch; a first end of the suppression circuit is connected to the control circuit, a second end of the suppression circuit is connected to the input end of the power amplifier circuit, and a third end of the suppression circuit is connected to a fixed potential point;
determining a preset period during which the active clamp circuit operates according to a voltage between the first end of the semiconductor switching device and a second end of the semiconductor switching device; and
turning on the controllable switch after operation of the active clamp circuit is completed, such that the input end of the power amplifier circuit is clamped to a fixed electrical potential.

15. The control method according to claim 14, wherein the fixed electrical potential is less than a gate voltage threshold of the semiconductor switching device.

16. The control method according to claim 14, wherein when the control circuit outputs a high level or a gate voltage of the semiconductor switching device is greater than a preset gate voltage, the controllable switch is turned off.

17. The control method according to claim 14, wherein when the operation of the active clamp circuit is completed and a gate voltage of the semiconductor switching device is a preset gate voltage, the controllable switch is turned on.

18. The control method according to claim 14, wherein the controllable switch is turned off within the preset period during which the active clamp circuit operates.

19. The control method according to claim 14, wherein the active clamp circuit operates from a first time to a second time, and the first time is defined as the time point when a voltage between the first end and the second end of the semiconductor switching device is greater than a preset voltage, and the second time is defined as the time point when a gate voltage of the semiconductor switching device is a preset gate voltage.

\* \* \* \* \*